United States Patent [19]
Roth et al.

[11] Patent Number: 5,387,842
[45] Date of Patent: Feb. 7, 1995

[54] STEADY-STATE, GLOW DISCHARGE PLASMA

[75] Inventors: John R. Roth; Peter P. Tsai; Chaoyu Liu, all of Knoxville, Tenn.

[73] Assignee: The University of Tennessee Research Corp., Knoxville, Tenn.

[21] Appl. No.: 68,508

[22] Filed: May 28, 1993

[51] Int. Cl.$^6$ .......................... H01J 7/24; H05B 31/26
[52] U.S. Cl. ............................. 315/111.21; 118/723 E; 313/231.31; 204/298.04
[58] Field of Search ....................... 315/111.21, 111.51; 118/723 E; 204/298.04; 219/121.1; 313/231.31

[56] References Cited

U.S. PATENT DOCUMENTS

| | | | |
|---|---|---|---|
| 4,469,932 | 9/1984 | Spiegelberg et al. | 313/231.31 |
| 4,687,573 | 8/1987 | Miller et al. | 210/143 |
| 4,771,730 | 9/1988 | Tezuka | 118/723 E |
| 4,919,968 | 4/1990 | Buhl et al. | 219/121.11 |
| 5,213,658 | 5/1993 | Ishida | 118/723 E |

FOREIGN PATENT DOCUMENTS

| | | | |
|---|---|---|---|
| 0200529 | 11/1983 | Japan | 315/111.21 |
| 1177374 | 8/1986 | Japan | 118/723 E |
| 0312223 | 12/1990 | Japan | 315/111.21 |

OTHER PUBLICATIONS

Authors: Naoki Kanda, Masuhiro Kogoma, Hiroshi Jinno, Hiroshi Uchiyama and Sachiko Okazaki Title: Atmospheric Pressure Glow Plasma and Its Application to Surface Treatment and Film Disposition Publication: International Union of Pure and Applied Chemistry. 10th International Symposium on Plasma Chemistry. Symposium Proceedings, vol. 3, Bochum, Germany, Aug. 4–9, 1991.

Authors: M. Kogoma, H. Kasai, K. Takahashi, T. Moriwaki and S. Okazaki Title: Wettability Control of a Plastic Surface by $CF_4-O_2$ Plasma and Its Etching Effect Publication: J. Phys. D: Appl. Phys., vol. 20, (1987).

Authors: S. Kanazawa, M. Kogoma, T. Moriwaki and S. Okazaki Title: Stable Glow Plasma at Atmospheric Pressure Publication: J. Phys. D: Appl. Phys., vol. 21 (1988).

Author: Chaoyu Liu Title: Plasma–Related Characteristics of a Steady–State Glow Discharge at Atmospheric Pressure Publication: Presented at the 1993 Sigma XI Graduate Student Paper Competition, The University of Tennessee, Knoxville, Tenn., Mar. 4, 1993.

Authors: C. Liu and J. R. Roth Title: Characteristics of a Steady–State, Low Power Glow Discharge at Atmospheric Pressure Publication: Bulletin of the American Physical Society Series II, vol. 37, No. 6, Nov., 1992.

Authors: J. Reece Roth, Mounir Laroussi and Chaoyu Liu Title: Experimental Generation of a Steady–State Glow Discharge at Atmospheric Pressure Publication: 1992 19th IEEE International Conference on Plasma Science, Conference Record–Abstracts–1–3 Jun., 1992.

Author: Witold Rakowski Title: Effect and Cost of Plasma Treatment of Polypropylene Melt Blown Webs Publication: Second Annual TANDEC Conference. 13–16 Oct., 1992.

Authors: Von Engel, A.; Seeliger, R.; and Steenbeck, M. Title: On the Glow Discharge At High Pressure. Publication: *Ziet, fur Physik*, vol. 85 (1993) pp. 144–160. English language translation of above from original German.

(List continued on next page.)

Primary Examiner—Robert J. Pascal
Assistant Examiner—Darius Gambino
Attorney, Agent, or Firm—Weiser & Associates

[57] ABSTRACT

A steady-state, glow discharge plasma is generated within the volume between a pair of parallel, insulated metal plate electrodes spaced up to 5 cm apart and R.F. energized with an rms potential of 1 to 5 KV at 1 to 100 KHz. The electrodes are located within an enclosure capable of maintaining an atmosphere other than atmospheric air between the electrode surfaces. Space between the electrodes is occupied by a noble gas such as helium, neon, argon, etc. or mixtures thereof.

22 Claims, 4 Drawing Sheets

OTHER PUBLICATIONS

EPO Publication No. 0,068,775 Issue Date: Jan. 5, 1983 Inventor: Hata, et al.

EPO Publication No. 0,117,561 Issue Date: Sep. 5, 1984 Inventor: Akagi, et al.

Authors: Wakida, T.; Kawamura, H.; Han L.: Hwan Kim, K.; Goto, T.; and Takagishi, T. Title: Changes In Surfaace Properties of Poly(ethylene terephthalate) Treated With Low Temperature Plasma: Effect of Pretreatment With Dimethylformamide Publication: *Sen-I-Gakkaishi*, vol. 42, No. 2 (1986).

Authors: Wakida, T.; Kawamura, H.; Song, J. C.; Goto, T.; Takagishi, T. Title: Surface Free Energy of Poly(ethylene Terepathalate) and Nylon 6 Films Treated With Low Temperature Plasma Publication: *Sen-I--Gakkaishi*, vol. 43, No. 7 (1987).

Japanese Patent No. 62-235,339 Issue Date: Oct. 15, 1987 Inventors: M. Kogoma et al.

Author: Rakowski, W. Title: Plasma Modification of Wool Under Industrial Conditions Publication: *Melliand Textilberichte*, vol. 70 (1989) pp. 780-785.

Authors: Roth, J. R.; Spence, P. D.; Liu, C. Title: Plasma-Related Characteristics of a Steady-State Glow Discharge at Atmospheric Pressure Publication: Paper 2P-18, *Proc. 1993 IEEE International Conference on Plasma Science*, Vancouver, B.C. IEEE Catalog No. 93-CH3334-0, ISBN 0-7803-1360-7 (1993), p. 129.

Authors: Roth J. R.; Spence, P. D.; Liu, C. Title: Preliminary Measurements of the Plasma Properties of a One Atmosphere Glow Discharge Plasma. Publication: Paper presented at *35th Annual Meeting of the APS Division of Plasma Physics*, St. Louis, Mo., Nov. 1-5, 1993; *APS Bulletin*, Series II, vol. 38, No. 10 (1993), p. 1901.

STEADY-STATE, GLOW DISCHARGE PLASMA

LICENSE RIGHTS

The U.S. Government has a paid-up license in this invention and the right in limited circumstances to require the patent owner to license others on reasonable terms as provided for by the terms of contract No. AFOSR 89-0319 awarded by The U.S. Air Force.

BACKGROUND OF THE INVENTION

1. Field of Invention

The present invention relates to methods and apparatus for generating low power density glow discharge plasmas at atmospheric pressure.

2. Description of the Prior Art

In the discipline of physics, the term "plasma" describes a partially ionized gas composed of ions, electrons and neutral species. This state of matter may be produced by the action of either very high temperatures, strong electric or radio frequency (R.F.) electromagnetic fields. High temperature or "hot" plasmas are represented by celestial light bodies, nuclear explosions and electric arcs. Glow discharge plasmas are produced by free electrons which are energized by an imposed direct current (DC) or R.F. electric fields and then collide with neutral molecules. These neutral molecule collisions transfer energy to the molecules and form a variety of active species including metastables, atomic species, free radicals and ions. These active species are chemically active and/or physically modify the surface of materials and may therefore serve as the basis of new chemical compounds and property modifications of existing compounds.

Low power plasmas known as dark discharge coronas have been widely used in the surface treatment of thermally sensitive materials such as paper, wool and synthetic polymers such as polyethylene, polypropylene, polyolefin, nylon and poly(ethylene terephthalate). Because of their relatively low energy content, corona discharge plasmas can alter the properties of a material surface without damaging the surface.

Glow discharge plasmas represent another type of low power density plasma useful for non-destructive material surface modification. These glow discharge plasmas can produce useful amounts of ultraviolet radiation. Glow discharge plasmas have the additional advantage therefore of producing UV radiation in the simultaneous presence of active species. However, glow discharge plasmas have heretofore been successfully generated typically in low pressure or partial vacuum environments below 10 torr, necessitating batch processing and the use of expensive vacuum systems.

It is, therefore, an object of the present invention to teach the construction and operating parameters of a glow discharge plasma operating at a gas pressure of about one atmosphere or slightly greater.

INVENTION SUMMARY

This and other objects of the invention to be subsequently explained or made apparent are accomplished with an apparatus based upon a pair of electrically insulated metallic plate electrodes. These plates are mounted in face-to-face parallel alignment with means for reciprocatory position adjustment up to at least 5 cm of separation. Preferably, the plates are water cooled and coated with a dielectric insulation.

A radio frequency power amplifier connected to both plates delivers up to several hundred watts of power at a working voltage of 1 to at least 5 KV rms and at 1 to 100 KHz.

At least in the volume between the plates wherein the glow discharge plasma is established, a one atmosphere charge of helium, argon or other noble gas is established and maintained.

BRIEF DESCRIPTION OF THE DRAWINGS

Relative to the drawings wherein like reference characters designate like or similar elements throughout the several figures of the drawings.

DESCRIPTION OF THE PREFERRED EMBODIMENT

Figure 1:
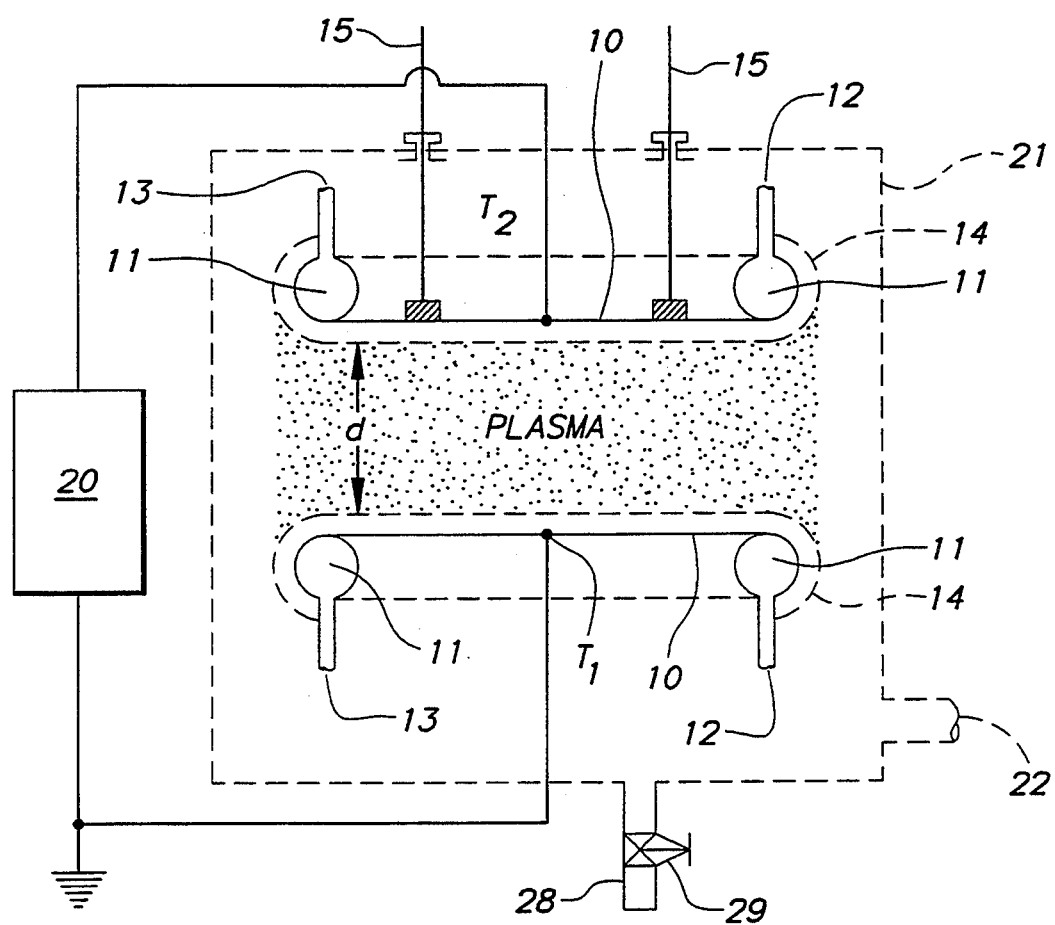
FIG. 1 is a schematic of the present invention component assembly.

Referring to the invention schematic illustrated by FIG. 1, the electrodes 10 are fabricated of copper plate having a representative square plan dimension of 25 cm$\times$25 cm. Silver soldered to the plates 10 are closed loops 11 of 1.9 cm copper tubing having hose nipples 12 and 13 connected therewith on opposite sides of the closed tubing loop. Not shown are fluid flow conduits connected to the inlet nipples 12 for delivering coolant fluid to the loop 11 and to the outlet nipples 13 for recovering such coolant fluid.

The integral metallic units comprising plates 10 and tubing 11 are covered with a high dielectric insulation material 14.

Preferably, some mechanism should be provided for adjusting the distance d between plates 10 up to at least cm separation while maintaining relative parallelism. Such a mechanism is represented schematically in FIG. 1 by the rod adjusters 15 secured to the upper plate 10. This arrangement anticipates a positionally fixed lower plate 10.

Energizing the plates 10 is a low impedance, high voltage, R.F. power amplifier 20 having independently variable voltage and frequency capacities over the respective ranges of 1 to at least 5 KV and 1 to 100 KHz.

Surrounding the plate assembly is an environmental isolation barrier 21 such as a structural enclosure suitable for maintaining a controlled gas atmosphere in the projected plan volume between the plates 10. Inlet port 22 is provided to receive an appropriate gas such as helium or argon, mixtures of either with air or a mixture of argon with helium. In any case, gas pressure within the isolation barrier 21 is substantially ambient thereby obviating or reducing the need for gas tight seals. Normally, it is sufficient to maintain a low flow rate of the modified atmosphere gas through the inlet port 22 that is sufficient to equal the leakage rate. Since the pressure within the isolation barrier 21 is essentially the same as that outside the barrier, no great pressure differential drives the leakage rate. A vent conduit 28 controlled by valve 29 is provided as an air escape channel during initial flushing of the enclosure. Thereafter, the valve 29 is closed for normal operation.

EXAMPLE 1

Figure 2:
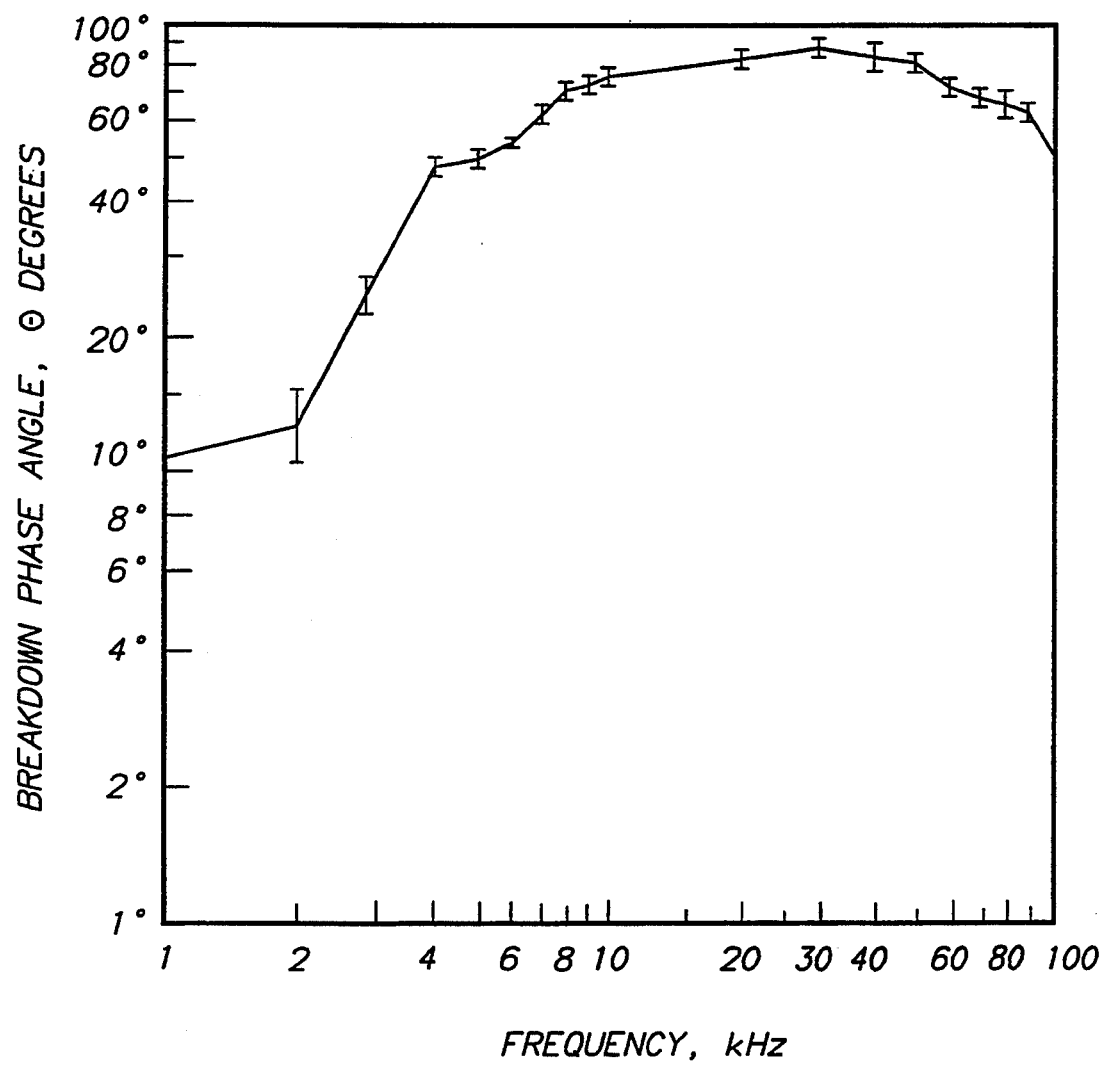
FIG. 2 is a graph of amplifier frequency and corresponding breakdown current phase angles respective to a particular operating example of the invention.
Figure 3:
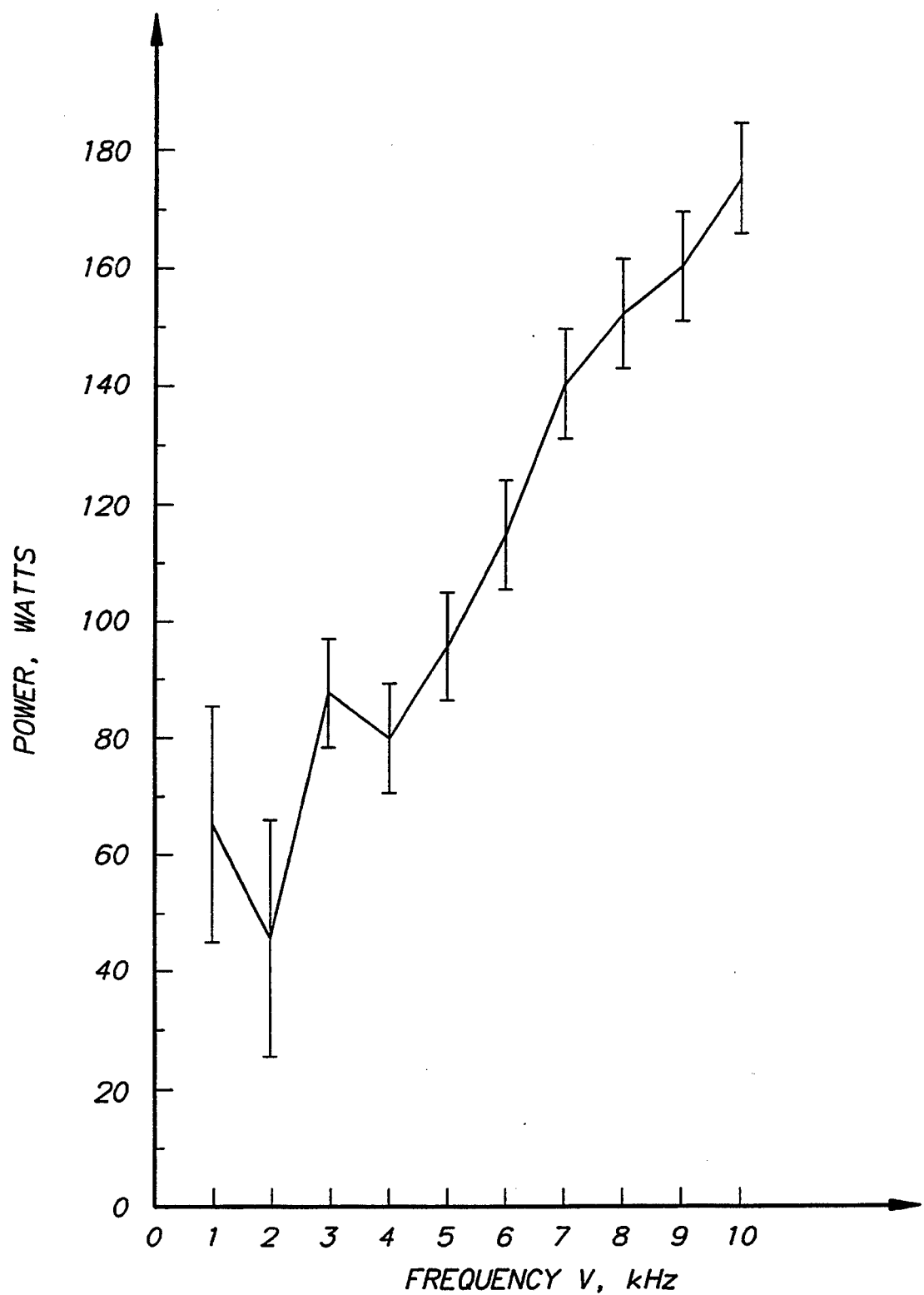
FIG. 3 is a graph of amplifier frequency and corresponding power consumption respective to a particular operating example of the invention.

In a first operational example of the invention, the above described physical apparatus sustained a glow discharge plasma in one atmosphere of helium at standard temperature with a separation distance d of 3.0 cm between plates 10. The plates were charged with a 4.4 KV working potential. Holding these parameters constant, the R.F. frequency was increased as an independent variable. As the dependent variable, FIG. 2 charts the corresponding breakdown current phase angle. Similarly, FIG. 3 charts the power required to sustain the plasma at the respective R.F. frequencies.

EXAMPLE 2

In a second operational example of the invention, the above described physical apparatus is used to sustain a glow discharge plasma in one atmosphere of helium at standard temperature with a separation distance d of 1.0 cm between plates 10. In this example, the frequency was held constant at 30 KHz while plate potential was manipulated as the independent variable and current breakdown phase angle, $\Theta$, (Table 1) and power, W, (Table 2) measured as dependent variables.

TABLE 1

| V (KV) | 1 | 1.5 | 2 | 2.5 | 3 | 3.5 |
|---|---|---|---|---|---|---|
| $\Theta$ (deg) | 28 | 40 | 61 | 46 | 65 | 76.5 |

TABLE 2

| V (KV) | 1 | 1.5 | 2 | 2.5 | 3 | 3.5 |
|---|---|---|---|---|---|---|
| P (W) | 7 | 13 | 22 | 57 | 50 | 44.9 |

EXAMPLE 3

A third operational example of the invention included a one atmosphere environment of helium between a 1 cm separation distance d between plate electrodes 10 charged at 1.5 KV rms potential. R.F. frequency was manipulated as the independent variable. As a measured dependent variable, Table 3 reports the corresponding phase angle $\Theta$ of breakdown current. The measured dependent variable of Table 4 reports the corresponding power consumption data.

TABLE 3

| f (KHz) | 10 | 20 | 30 | 40 | 50 | 60 | 70 | 80 | 90 | 100 |
|---|---|---|---|---|---|---|---|---|---|---|
| $\Theta$ (deg) | 43 | 32 | 43 | 52 | 54 | 61 | 60 | 56 | 45 | 22.5 |

TABLE 4

| f (KHz) | 10 | 20 | 30 | 40 | 50 | 60 | 70 | 80 | 90 | 100 |
|---|---|---|---|---|---|---|---|---|---|---|
| P (W) | 5 | 8 | 11 | 19 | 35 | 43 | 47 | 57 | 89 | 124 |

EXAMPLE 4

The largest volume helium plasma of 2.8 liters was achieved with the above described apparatus at a 4.5 cm plate separation having a 5 KV potential charged at 4 KHz.

Figure 4:
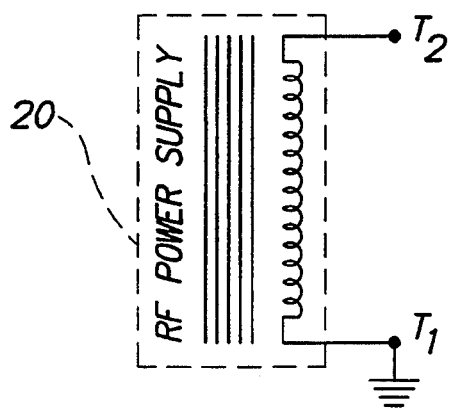
FIGS. 4, 5 and 6 represent alternative power supply circuits.
Figure 6:
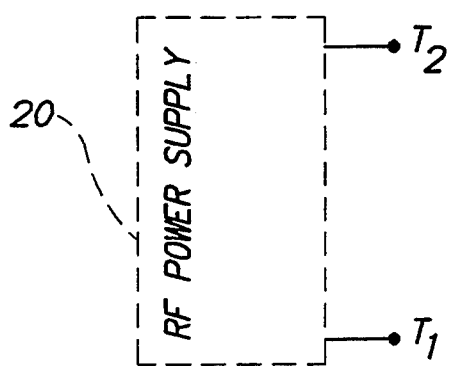

It will be understood by those of ordinary skill in the art that the present invention is capable of numerous arrangements, modifications and substitutions of parts without departing from the scope of the invention. In particular, FIGS. 4 and 6 represent respective power supply options having respective attractions. FIG. 4 corresponds to the FIG. 1 illustration wherein the bottom electrode terminal $T_1$ is connected to ground potential and the top terminal $T_2$ is charged at the full working potential.

Figure 5:
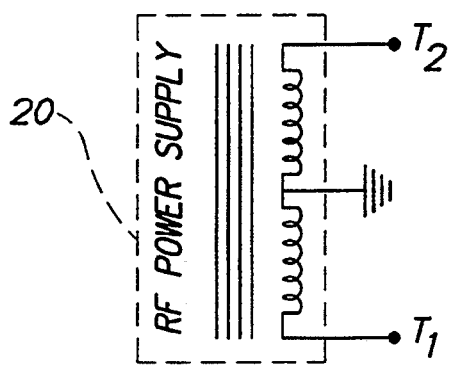

FIGS. 4, 5 and 6 are electrical equivalents wherein the $T_1$ and $T_2$ voltages are 180° out of phase but at only half the maximum potential. FIG. 5 represents a grounded center tap transformer whereas FIG. 6 represents a solid state power circuit embodiment with or without a provision for a grounded center tap.

We claim:

1. Apparatus to generate and maintain a glow discharge plasma at a pressure of about 1 atmosphere, the apparatus comprising a pair of electrically insulated plate electrodes aligned and secured in parallel facing position, means for supplying and maintaining a noble gas at a pressure of about one atmosphere in the volumetric space between said plate electrodes, and radio frequency amplifier means for generating and maintaining a glow discharge plasma by energizing said electrodes with a potential of 1 to at least 5 KV rms at 1 to 100 KHz.

2. An apparatus as described by claim 1 wherein the electrodes are spaced within 5 cm of each other.

3. An apparatus as described by claim 1 which comprises means for establishing and maintaining a gas barrier envelope surrounding said plates and the volumetric space therebetween.

4. An apparatus as described by claim 3 wherein said means for supplying and maintaining the gas comprises gas supply means to provide a substantially steady supply flow of said gas.

5. An apparatus as described by claim 1 wherein said gas is helium.

6. An apparatus as described by claim 1 wherein said gas is a mixture of helium and air.

7. An apparatus as described by claim 1 wherein said gas is argon.

8. An apparatus as described by claim 1 wherein said gas is a mixture of argon and air.

9. An apparatus as described by claim 1 wherein said gas is a mixture of argon and helium.

10. An apparatus as described by claim 1 wherein said plates are fluid cooled.

11. An apparatus as described by claim 10 wherein fluid flow conduits are bonded to said plates to extract heat from said plates.

12. A method of generating and maintaining a glow discharge plasma at a pressure of about 1 atmosphere within a volumetric space between two parallel plate electrodes energized by radio frequency amplifier means, said method comprising the steps of operating said amplifier means to energize said electrodes with a potential of 1 to at least 5 KV rms at 1 to 100 KHz frequency while charging and maintaining the volumetric space between said electrodes with a noble gas at approximately 1 atmosphere of pressure.

13. A method as described by claim 12 wherein said electrodes are enclosed by an environmental gas barrier internally charged by a substantially continuous flow of said gas.

14. A method as described by claim 13 wherein said gas is helium.

15. A method as described by claim 13 wherein said gas is a mixture of helium and air.

16. A method as described by claim 13 wherein said gas is argon.

17. A method as described by claim 13 wherein said gas is a mixture of argon and air.

18. A method as described by claim 13 wherein said gas is a mixture comprising helium and argon.

19. A method as described by claim 12 wherein said electrodes are positioned at a separation distance therebetween of 5 cm or less.

20. A method as described by claim 19 wherein at least one of said electrodes is positionally adjustable relative to the other.

21. A method as described by claim 12 wherein said amplifier frequency is variable over the range of 1 to 100 KHz.

22. A method as described by claim 12 wherein said amplifier potential is variable over the range of 1 to at least 5 KV rms.

* * * * *